(12) United States Patent
Chang et al.

(10) Patent No.: US 11,658,610 B2
(45) Date of Patent: May 23, 2023

(54) PHOTOELECTRIC ENERGY CONVERSION DEVICE

(71) Applicant: SEA SONIC ELECTRONICS CO., LTD., Taipei (TW)

(72) Inventors: Hsiu-Cheng Chang, Taipei (TW); Sheng-Chien Chou, Taipei (TW)

(73) Assignee: SEA SONIC ELECTRONICS CO., LTD., Taipei (TW)

( * ) Notice: Subject to any disclaimer, the term of this patent is extended or adjusted under 35 U.S.C. 154(b) by 0 days.

(21) Appl. No.: 17/506,016

(22) Filed: Oct. 20, 2021

(65) Prior Publication Data

US 2022/0149780 A1 May 12, 2022

Related U.S. Application Data

(60) Provisional application No. 63/111,778, filed on Nov. 10, 2020.

(51) Int. Cl.
*H02S 40/30* (2014.01)
*H01L 31/12* (2006.01)
*H01L 25/16* (2023.01)
*H02M 3/158* (2006.01)

(52) U.S. Cl.
CPC ............ *H02S 40/30* (2014.12); *H01L 25/167* (2013.01); *H01L 31/125* (2013.01); *H02M 3/1582* (2013.01)

(58) Field of Classification Search
CPC ............... H01L 31/0586; H01L 31/055; H01L 31/02325; H01L 31/0522; H01L 31/0524; H01L 31/0525; H01L 31/0258; H01L 31/0527; H01L 31/02327; H01B 10/807; H04B 10/807; F21S 9/037; H02S 40/32; H02S 99/00
See application file for complete search history.

(56) References Cited

U.S. PATENT DOCUMENTS

| | | | | |
|---|---|---|---|---|
| 4,730,115 A | * | 3/1988 | Abe ...................... | H01L 31/167 257/E31.107 |
| 5,828,074 A | * | 10/1998 | Pearlman .............. | H01L 31/167 257/E31.108 |
| 8,348,453 B2 | * | 1/2013 | Cumberland .......... | H05B 47/11 362/276 |

(Continued)

FOREIGN PATENT DOCUMENTS

| | | | |
|---|---|---|---|
| JP | 2004320976 A | * 11/2004 | |
| WO | WO-2017222023 A1 | * 12/2017 | ........... H01L 25/167 |

*Primary Examiner* — Ryan S Cannon
(74) *Attorney, Agent, or Firm* — Muncy, Geissler, Olds & Lowe, P.C.

(57) ABSTRACT

The invention provides a photoelectric energy conversion device applied to a power conversion circuit to replace a magnetic component which is widely used in a power conversion circuit. The photoelectric energy conversion device includes a shell, at least one light generator, and at least one photovoltaic generator, wherein the at least one light generator and the at least one photovoltaic generator are packaged in the shell. The at least one photovoltaic generator receives light generated in the shell by the at least one light generator and generates electric energy based on the light, and the at least one photovoltaic generator serves as a power supply source for a back-end circuit of the photoelectric energy conversion device.

8 Claims, 6 Drawing Sheets

(56) References Cited

U.S. PATENT DOCUMENTS

| | | | |
|---|---|---|---|
| 2011/0007504 A1* | 1/2011 | Chu | F21S 9/037 |
| | | | 362/253 |
| 2013/0119409 A1* | 5/2013 | Zhao | H01L 31/12 |
| | | | 257/84 |
| 2015/0214414 A1* | 7/2015 | Hodges | H02S 99/00 |
| | | | 136/246 |
| 2021/0083141 A1* | 3/2021 | Scheller | H01L 41/0926 |

* cited by examiner

PHOTOELECTRIC ENERGY CONVERSION DEVICE

CROSS REFERENCE TO RELATED APPLICATIONS

This application claims priority of U.S. Provisional Application No. 63/111,778 filed on Nov. 10, 2020 under 35 U.S.C. § 119(e), the entire contents of all of which are hereby incorporated by reference.

FIELD OF THE INVENTION

The invention relates to a photoelectric energy conversion device, and more particularly, to a photoelectric energy conversion device including a light generator and a photovoltaic generator therein to replace a conventional magnetic component.

BACKGROUND OF THE INVENTION

Typically, a circuit comprises three basic components, namely a resistor, a capacitor, and a magnetic component, wherein the magnetic component further includes an inductor and a transformer.

In a power conversion circuit, a magnetic component plays a dominant role in energy conversion. The magnetic characteristics may differ in different designs of the magnetic component due to the structure of the magnetic component consisting of a coil and an iron core, hence the magnetic characteristics (i.e., magnetic saturation and hysteresis) of the magnetic component must be considered in the design of the circuit. Further, in a combination of a plurality of magnetic components, for example, a combination of an inductor and a transformer, parameters associated with resonance must also be considered. As a result, the overall design of the circuit and the control must be designed depending on the parameters of the magnetic component.

Moreover, in addition to the conversion loss when the magnetic assembly is used for converting the magnetic energy into electric energy, the magnetic assembly also interferes the cooperative electronic components or other adjacent electronic components.

SUMMARY OF THE INVENTION

The major object of the invention is to solve the practical problems resulted from a magnetic component.

To achieve the object, the invention provides a photoelectric energy conversion device applied to a power conversion circuit. The photoelectric energy conversion device comprises a shell, at least one light generator, and at least one photovoltaic generator. The at least one light generator and the at least one photovoltaic generator are packaged in the shell. The at least one photovoltaic generator receives light generated in the shell by the at least one light generator and generates electric energy based on the light, and the at least one photovoltaic generator serves as a power supply source of a back-end circuit of the photoelectric energy conversion device.

In an embodiment, the photoelectric energy conversion device comprises a plurality of light generators arranged in an M×N matrix, where M≥2 and N≥2.

In an embodiment, the plurality of light generators is electrically connected in series, parallel, or both in series and parallel.

In an embodiment, the photoelectric energy conversion device comprises a plurality of photovoltaic generators arranged in a P×O matrix, where P≥2 and O≥2.

In an embodiment, the number of the plurality of light generators is not equal to the number of the plurality of photovoltaic generators.

In an embodiment, the plurality of light generators is electrically connected in series, parallel, or both in series and parallel.

In an embodiment, the at least one light generator is spaced from the at least one photovoltaic generator in the shell.

The invention is more advantageous than the prior art in that the photoelectric energy conversion device does not generate a large amount of interference energy in the energy conversion process, and therefore the design and control of the whole circuit are simplified.

DETAILED DESCRIPTION OF THE PREFERRED EMBODIMENTS

The detailed description and technical aspects of the invention are described with reference to the drawings as follows.

Figure 1:
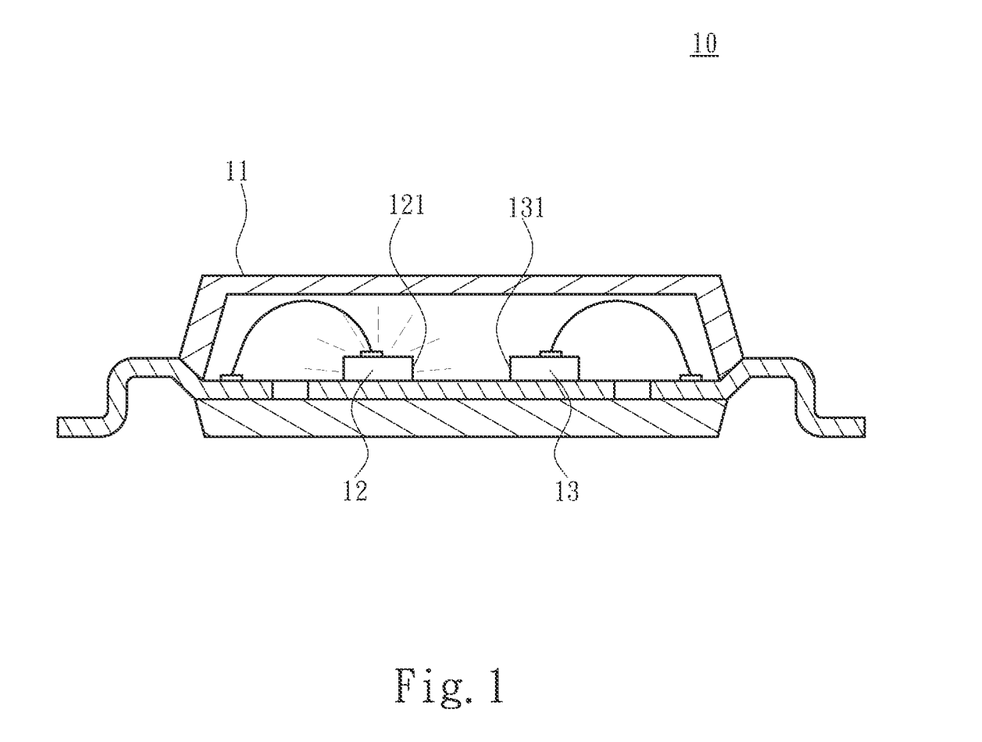
FIG. 1 is a schematic diagram showing a structure of the photoelectric energy conversion device of the invention.
Figure 2:
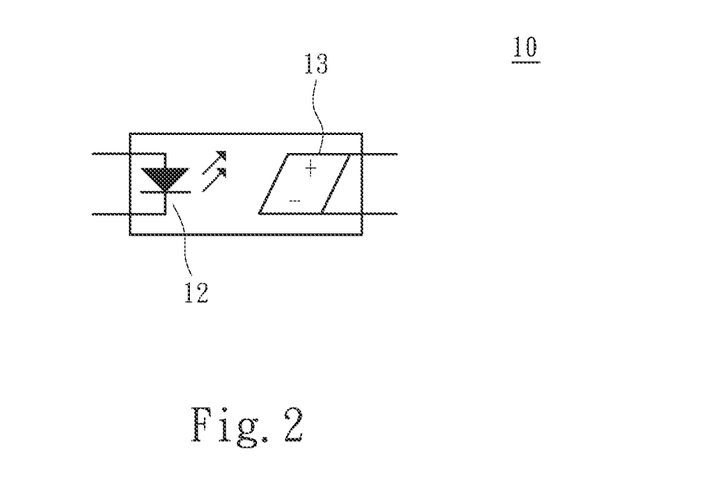
FIG. 2 is a schematic diagram showing a unit of the photoelectric energy conversion device in an embodiment of the invention.
Figure 3:
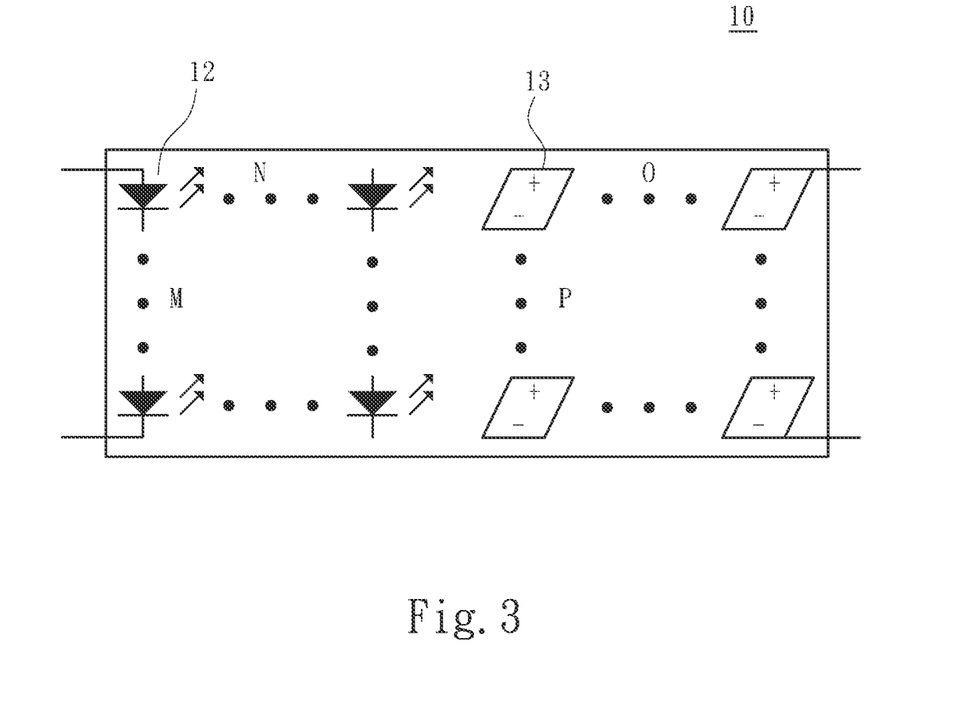
FIG. 3 is a schematic diagram showing a unit of the photoelectric energy conversion device in another embodiment of the invention.

Please refer to FIG. 1, FIG. 2, and FIG. 3. The invention provides a photoelectric energy conversion device 10 which replaces magnetic components, such as inductors and transformers, used in a conventional power conversion circuit, that is, the photoelectric energy conversion device 10 is regarded as a part of a circuit. In particular, the photoelectric energy conversion device 10 is packaged as an independent member. The photoelectric energy conversion device 10 may be implemented as an integrated circuit (IC). The photoelectric energy conversion device 10 includes a shell 11, at least one light generator 12, and at least one photovoltaic generator 13. The at least one light generator 12 and the at least one photovoltaic generator 13 are simultaneously packaged in the shell 11. The at least one light generator 12 and the at least one photovoltaic generator 13 are respectively connected with an external circuit through a plurality of electrodes connected thereto. Furthermore, there is no direct or indirect connection between the at least one light generator 12 and the at least one photovoltaic generator 13, hence power isolation desirable in the invention is realized. In an embodiment, a spacing is provided between the at least one light generator 12 and the at least one photovoltaic generator 13. In another aspect, the at least one light generator 12 may be designed to comprise a light projecting surface 121 facing the at least one photovoltaic generator 13. Similarly, the at least one photovoltaic generator 13 may be designed to comprise a light receiving surface 131 facing the at least one light generator 12 in such a manner that the at least one photovoltaic generator 13 surely receives the light projected by the at least one light generator 12. Furthermore, the light projecting surface 121 or the light receiving surface 131 is not limited to a vertical surface, but may be designed appropriately according to the internal structure of the shell 11. In an embodiment, an appropriately sized chamber structure is formed within the shell 11 to facilitate light transmission. The chamber structure has to be sized at least sufficient for accommodating the at least one light generator 12 and at least one the photovoltaic generator 13. Moreover, the chamber structure can be redesigned depending on the light path requirements of the at least one light generator 12 and the at least one photovoltaic generator 13.

Furthermore, the at least one light generator 12 and the at least one photovoltaic generator 13 may be respectively implemented in a semiconductor structure.

Figure 4:
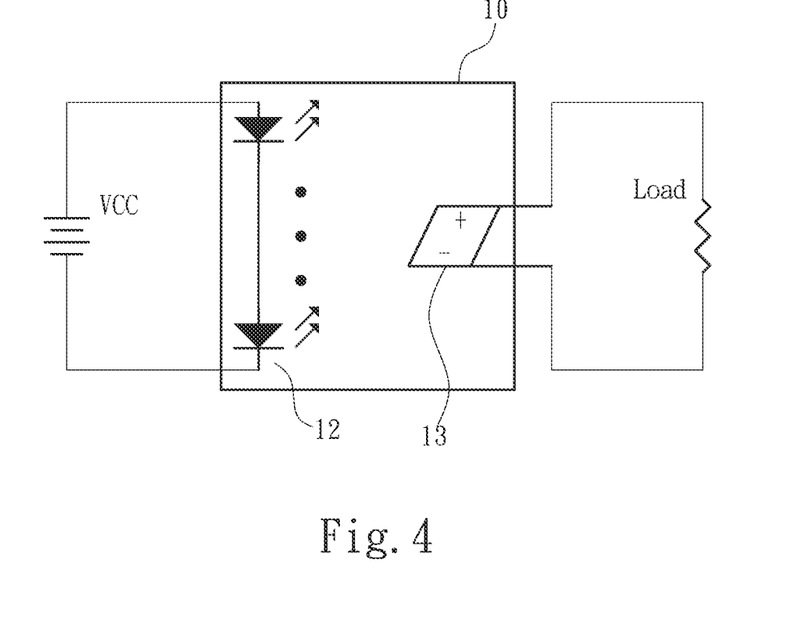
FIG. 4 is a schematic diagram of the photoelectric energy conversion device of the invention implemented in an isolated buck conversion circuit.

In conjunction with FIG. 4, as the photoelectric energy conversion device 10 of the invention is implemented, the at least one light generator 12 acquires power from a power input source or a preceding circuit through the electrodes connected thereto, and generates light based on the acquired power. The light generated by the at least one light generator 12 projects to the at least one photovoltaic generator 13 which then converts luminous energy into electric energy once receiving the light. The at least one light generator 12 outputs electric energy to a back-end circuit connected with the photoelectric energy conversion device 10 through the electrodes connected thereto, that is, the at least one photovoltaic generator 13 is used as a power supply source for the back-end circuit. It is to be understood that the photoelectric energy conversion device 10 of the invention differs from a conventional optical coupler in that the optical coupler can only serve as signal transmission and cannot serve as a power supply source for the back-end circuit, unlike the energy transmission in the invention.

Furthermore, the at least one light generator 12 of the invention is implemented as a light emitting diode (LED) in an embodiment. To achieve efficient energy conversion, the light emitting diode is implemented by selecting one with a strong luminous intensity or a strong directivity. Furthermore, the at least one light generator 12 of the invention is not limited to a single implementation. The quantity of the at least one light generator 12 implemented is possible to be increased or decreased based on a buck-boost requirement or a withstand voltage requirement. Once the at least one light generator 12 is implemented in a plurality form, and the plurality of the light generators 12 may be implemented in series (in M units), parallel (in N units), or both in series and parallel. Further, the plurality of light generators 12 may be arranged in an M×N matrix, where M≥2 and N≥2, as shown in FIG. 3. In another aspect, the at least one photovoltaic generator 13 of the invention is not connected to any power source and is connected to the back-end circuit or a load through the electrode connected thereto. The at least one photovoltaic generator 13 is an electric power output. The at least one photovoltaic generator 13 works in such a manner that converts the received luminous energy into electric energy through a photoelectric semiconductor structure to which the at least one photovoltaic generator 13 belongs and outputs the electric energy to the back-end circuit. In an embodiment, the at least one photovoltaic generator 13 may be a photovoltaic cell. Similarly, the at least one photovoltaic generator 13 may be implemented in a plurality form, and the plurality of the photovoltaic generators 13 may be implemented in series (in P units), parallel (in O units), or both in series and parallel. Furthermore, the plurality of the photovoltaic generators 13 may also be arranged in a P×O matrix, where P≥2 and O≥2, as shown in FIG. 3. Therefore, different input voltage, output voltage and power requirements can be met by means of the serial and parallel connection of both the light generators 12 and the photovoltaic generators 13.

Figure 5:
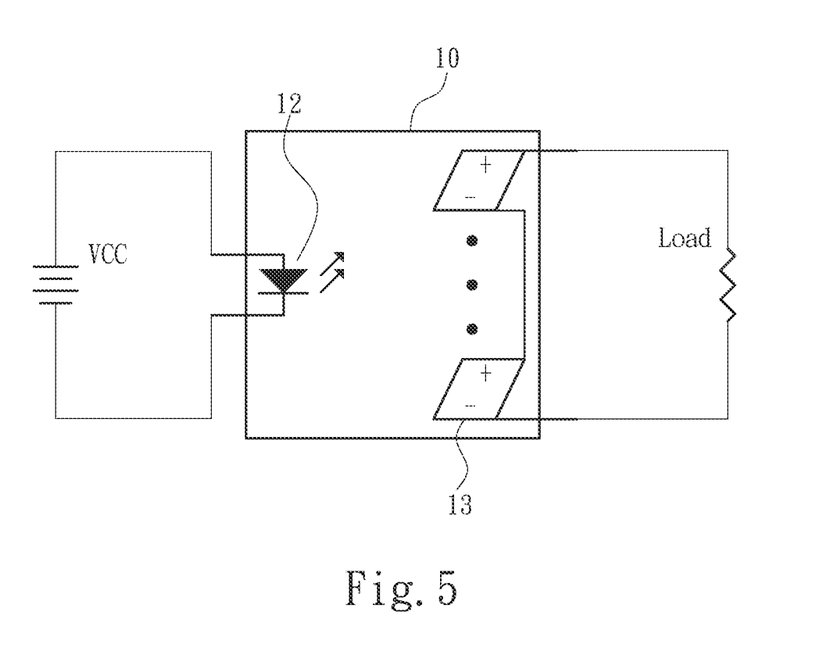
FIG. 5 is a schematic diagram of the photoelectric energy conversion device of the invention implemented in an isolated boost conversion circuit.
Figure 6:
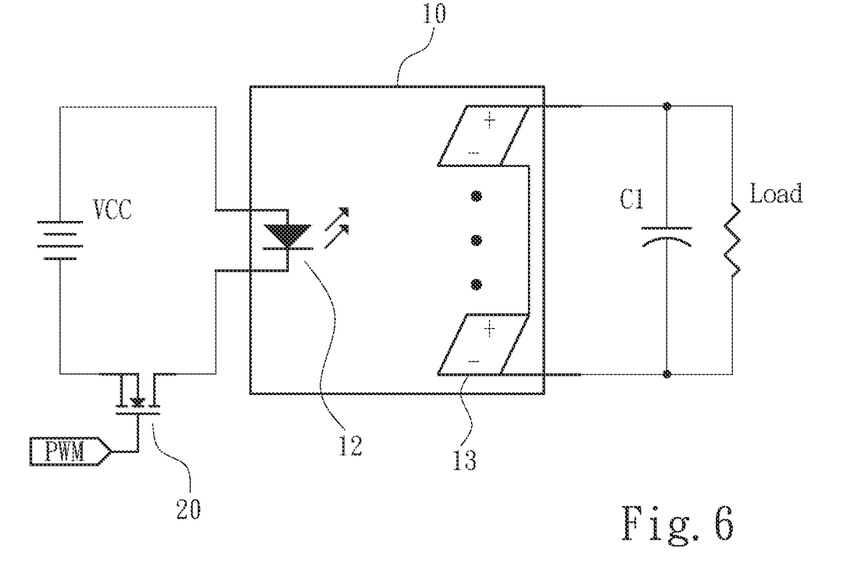
FIG. 6 is a schematic diagram of the photoelectric energy conversion device of the invention implemented in an isolated buck-boost conversion circuit.
Figure 7:
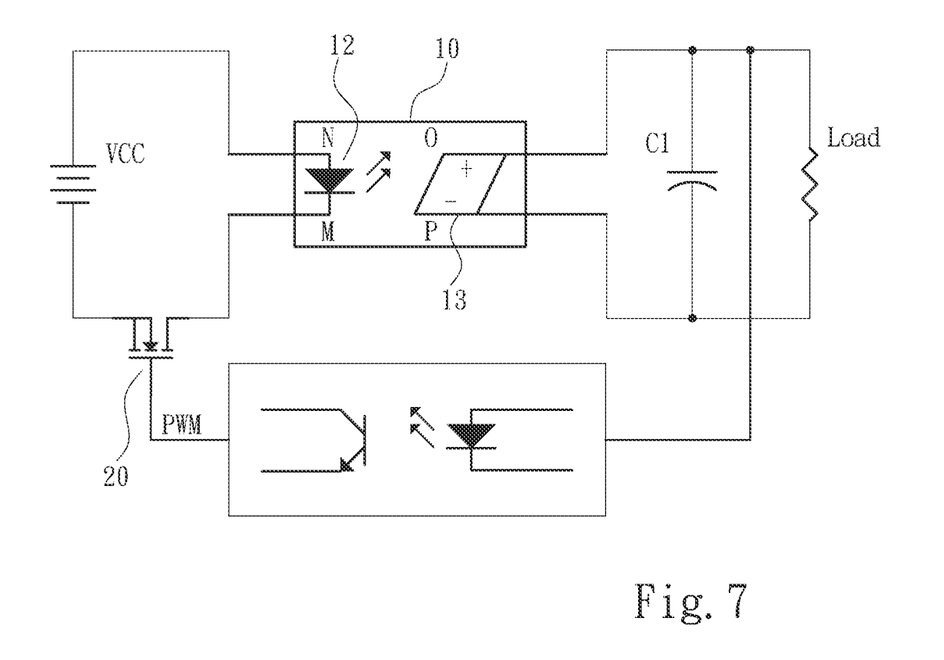
FIG. 7 is a schematic diagram of the photoelectric energy conversion device of the invention implemented in an isolated boost, buck, and boost-buck conversion circuit with feedback control.
Figure 8:
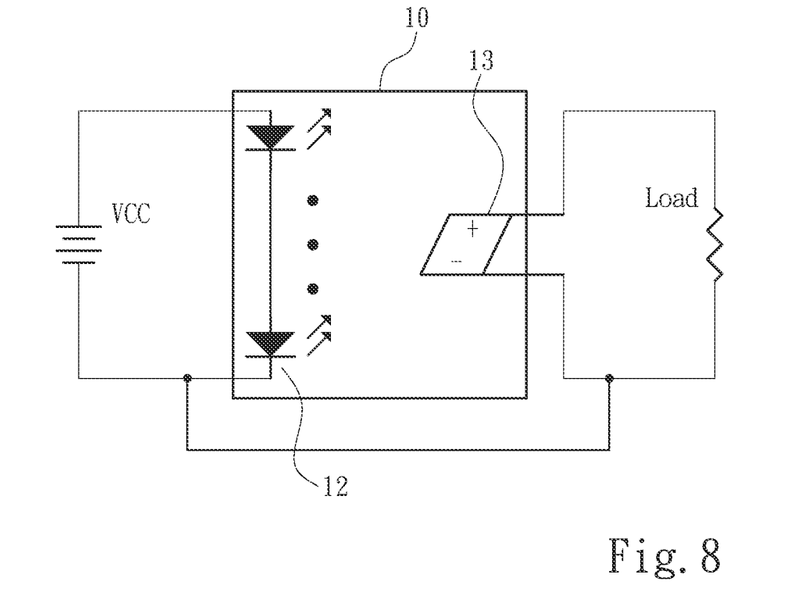
FIG. 8 is a schematic diagram of the photoelectric energy conversion device of the present disclosure implemented in a non-isolated buck converter.
Figure 9:
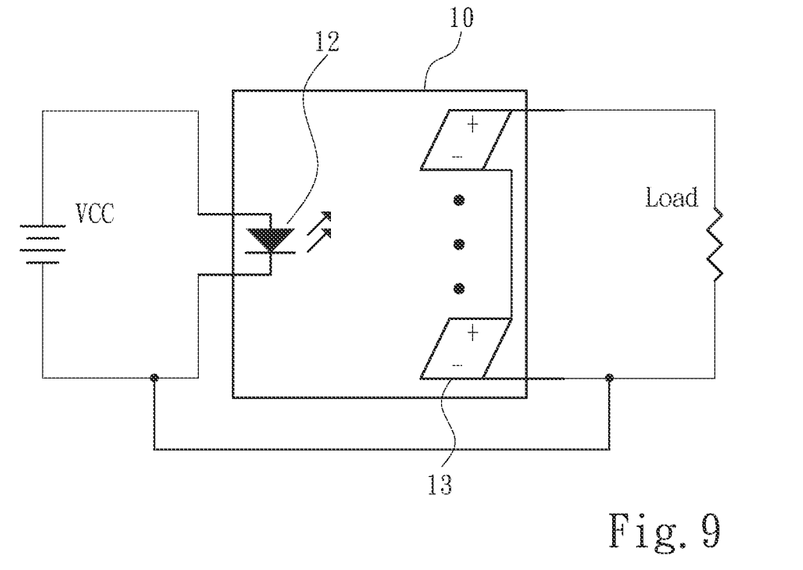
FIG. 9 is a schematic diagram of the photoelectric energy conversion device of the invention implemented in a non-isolated boost converter.
Figure 10:
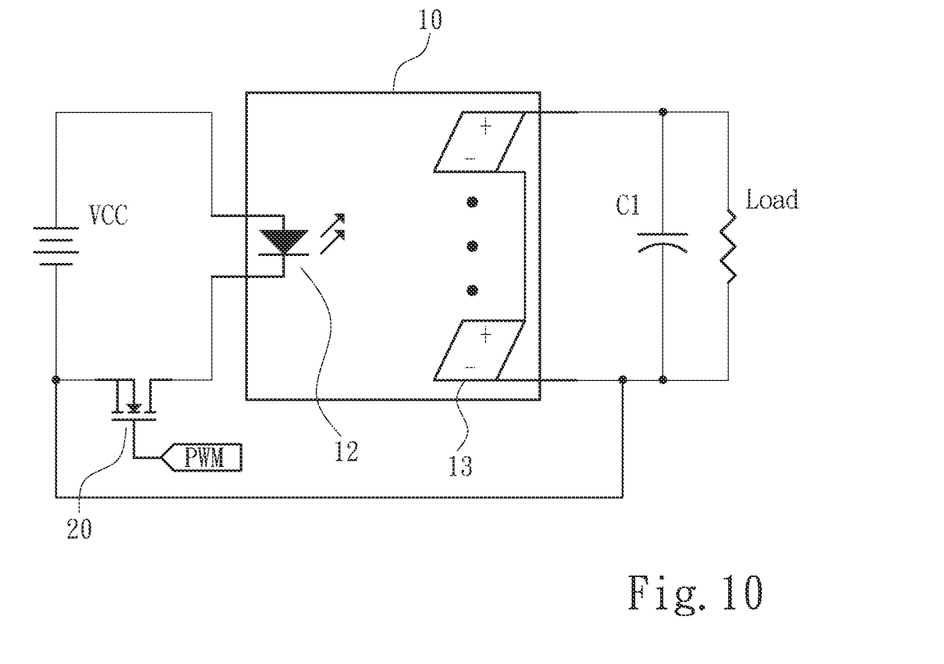
FIG. 10 is a schematic diagram of the photoelectric energy conversion device of the invention implemented in a non-isolated buck-boost converter.
Figure 11:
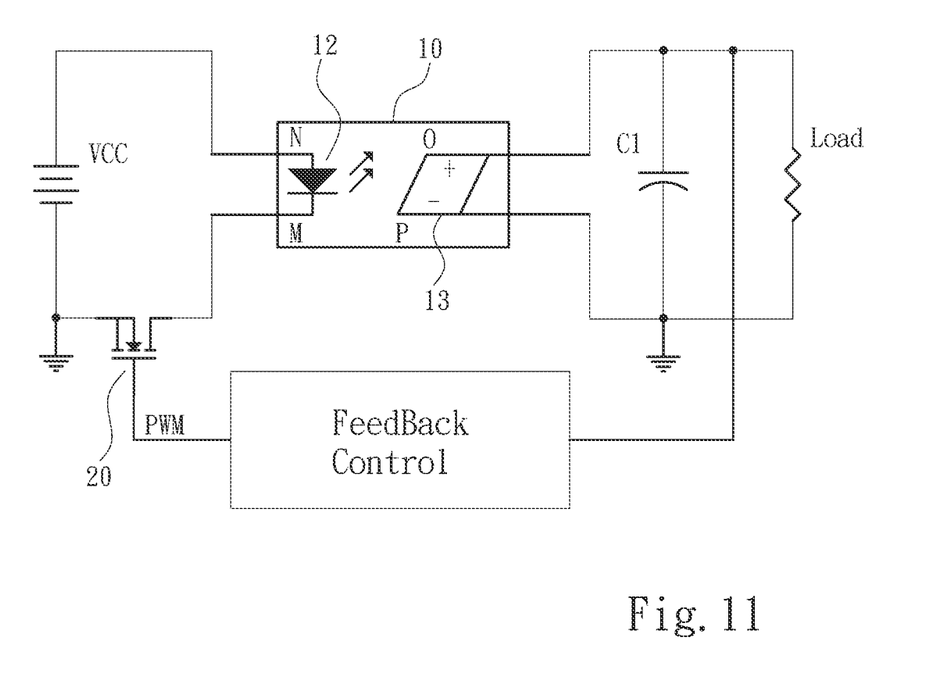
FIG. 11 is a schematic diagram of the photoelectric energy conversion device of the invention implemented in a non-isolated boost, buck, and boost/buck conversion circuit with feedback control.

The photoelectric energy conversion device 10 is provided herein as an illustration of a component to which the power conversion circuit belongs. FIG. 4 is a schematic diagram of the photoelectric energy conversion device 10 of the invention implemented in an isolated buck conversion circuit. In this embodiment, the quantity of the light at least one generator 12 in the photoelectric energy conversion device 10 may be more than the quantity of the at least one photovoltaic generator 13. Furthermore, FIG. 5 is a schematic diagram of the photoelectric energy conversion device 10 of the invention implemented in an isolated boost conversion circuit. In this embodiment, the quantity of the at least one light generator 12 in the photoelectric energy conversion device 10 may be less than the number of the photovoltaic generators 13. Furthermore, FIG. 6 is a schematic diagram of the photoelectric energy conversion device 10 of the invention implemented in an isolated buck-boost conversion circuit. In this embodiment, the photoelectric energy conversion device 10 cooperates with a switch 20 that turns on and off based on a pulse width modulation (PWM) signal to cause the photoelectric energy conversion device 10 to boost or buck. Furthermore, FIG. 7 is a schematic diagram of the photoelectric energy conversion device 10 of the invention implemented in an isolated boost, buck, and boost/buck conversion circuit with feedback control by means of the serial and parallel connection of a plurality of the light generators 12 and the serial and parallel connection of a plurality of the photovoltaic generators 13. Furthermore, FIG. 8 is a schematic diagram of the photoelectric energy conversion device 10 of the invention implemented in a non-isolated buck converter. Furthermore, FIG. 9 is a schematic diagram of the photoelectric energy conversion device 10 of the invention implemented in a non-isolated boost converter. Furthermore, FIG. 10 is a schematic diagram of the photoelectric energy conversion device of the invention implemented in a non-isolated buck-boost converter. Furthermore, FIG. 11 is a schematic diagram of the photoelectric energy conversion device 10 of the invention implemented in a non-isolated boost, buck, and boost/buck conversion circuit with feedback control.

In summary, the photoelectric energy conversion device 10 of the invention does not generate a large amount of interference energy in the energy conversion process, and therefore the design and control of the whole circuit is simplified. The invention, by means of the photoelectric energy conversion device 10, specifically solves the problems of:

1. Complexity of characteristics in the conventional magnetic component limits the implementation of a power conversion circuit. The characteristic alternation of the magnetic component due to slight loss in the development influences the efficiency of the power conversion circuit.

2. The structure of the magnetic component substantially influences the conversion loss of the power conversion circuit.

3. Significant amount of interfering energy generated by the conventional magnetic component when converting magnetic energy into electrical energy, which easily affects cooperative electronic components or other adjacent electronic components.

What is claimed is:

1. A photoelectric energy conversion device, applied to a power conversion circuit and implemented as an integrated circuit (IC), comprising:
   a shell;
   a preceding circuit;
   at least one light generator, connected to the preceding circuit to acquire power;
   at least one photovoltaic generator;
   a back-end circuit, connected to the at least one photovoltaic generator;
   a switch, connected to the preceding circuit and the at least one light generator; and
   a feedback control unit, connected to the switch and the at least one photovoltaic generator,
   wherein the at least one light generator and the at least one photovoltaic generator are packaged in the shell simultaneously, the at least one photovoltaic generator receives light generated by the at least one light generator in the shell and generates electric energy based on the light, and the at least one photovoltaic generator serves as a power supply source of the back-end circuit of the photoelectric energy conversion device, and the feedback control unit is disposed to control the switch with a pulse width modulation (PWM) signal to cause the photoelectric energy conversion device to boost or buck.

2. The photoelectric energy conversion device according to claim 1, wherein the photoelectric energy conversion device comprises a plurality of light generators arranged in an M×N matrix, where M≥2 and N≥2.

3. The photoelectric energy conversion device according to claim 2, wherein the plurality of light generators are electrically connected in series, parallel, or both in series and parallel.

4. The photoelectric energy conversion device according to claim 2, wherein the photoelectric energy conversion device comprises a plurality of photovoltaic generators arranged in a P×O matrix, where P≥2 and O≥2.

5. The photoelectric energy conversion device according to claim 4, wherein a number of the plurality of light generators is not equal to a number of the plurality of photovoltaic generators.

6. The photoelectric energy conversion device according to claim 4, wherein the plurality of light generators is electrically connected in series, parallel, or both in series and parallel.

7. The photoelectric energy conversion device according to claim 1, wherein the at least one light generator is spaced from the at least one photovoltaic generator in the shell.

8. The photoelectric energy conversion device according to claim 1, wherein the photoelectric energy conversion device comprises a plurality of photovoltaic generators arranged in a P×O matrix, where P≥2 and O≥2.

* * * * *